United States Patent [19]

Kressel et al.

[11] 3,762,968

[45] Oct. 2, 1973

[54] METHOD OF FORMING REGION OF A DESIRED CONDUCTIVITY TYPE IN THE SURFACE OF A SEMICONDUCTOR BODY

[75] Inventors: Henry Kressel, Elizabeth; Herbert Nelson, Princeton, both of N.J.

[73] Assignee: RCA Corporation, New York, N.Y.

[22] Filed: Apr. 7, 1971

[21] Appl. No.: 131,956

[52] U.S. Cl.......... 148/171, 148/172, 252/62.3 GA, 117/201

[51] Int. Cl.............................................. H01l 7/38

[58] Field of Search............................ 148/171, 188

[56] References Cited

UNITED STATES PATENTS

| | | | |
|---|---|---|---|
| 3,514,348 | 5/1970 | Ku | 148/188 |
| 3,502,517 | 3/1970 | Sussmann | 148/188 |
| 3,560,276 | 2/1971 | Panish et al. | 148/171 |
| 3,537,029 | 10/1970 | Kressel et al. | 148/171 UX |

*Primary Examiner*—G. T. Ozaki
*Attorney*—Glenn H. Bruestle

[57] ABSTRACT

A body of single crystalline gallium arsenide or aluminum gallium arsenide containing a relatively low concentration of aluminum is coated by liquid phase epitaxy with a layer of aluminum gallium arsenide containing a relatively high concentration of aluminum. The aluminum gallium arsenide layer has therein a desired conductivity modifier. The coated body is heated to diffuse the conductivity modifier from the layer into the body to form a region of a desired conductivity along the surface of the body. At least a portion of the layer is etched away with an etchant which does not attack the material of the body, such as boiling hydrochloric acid, to expose at least a portion of the surface of the body.

6 Claims, 5 Drawing Figures

INVENTORS
Henry Kressel &
Herbert Nelson
BY Donald S. Cohen
ATTORNEY

METHOD OF FORMING REGION OF A DESIRED CONDUCTIVITY TYPE IN THE SURFACE OF A SEMICONDUCTOR BODY

BACKGROUND OF THE INVENTION

The present invention relates to a method of forming a region of a desired conductivity type in the surface of a semiconductor body, and more particularly to a method of forming such a region in a body of single crystalline gallium arsenide or aluminum gallium arsenide without creating any crystal damage on or adjacent the surface of the body.

Many types of semiconductors require a thin region of a desired conductivity type in a body of single crystalline semiconductor material along a surface of the body. The region may be of a conductivity type opposite to the conductivity type of the body, such as a P type region in an N type body or an N type region in a P type body, to form a P-N junction, or the region may be of the same conductivity type as the body but of a higher concentration of the conductivity modifier, such as a P+ type region in a P type body or an N+ type region in an N type body. Generally, such a region is formed in a body by placing the body in a chamber, filling the chamber with vapors of the desired conductivity modifier, and heating the body to diffuse the conductivity modifier into the body along the surface of the body.

When this process is used to form thin regions in a body of either single crystalline gallium arsenide or aluminum gallium arsenide certain problems have arisen. It has been found that the diffusion of the vapors of the conductivity modifier into the body of gallium arsenide or aluminum gallium arsenide causes extensive crystal damage in the surface of the body and in the portion of the body directly adjacent the surface. Such crystal damage adversely affects the electrical characteristics of the semiconductor devices being formed. Also, it has been found that it is difficult to control the thickness of the region and the profile of the concentration of the conductivity modifier in the thin region using this diffusion method.

SUMMARY OF THE INVENTION

A region of a desired conductivity type is formed in a surface of a body of single crystalline gallium arsenide or alloy thereof by depositing on the surface of the body a layer of a single crystalline material containing the desired conductivity modifier. The material of the layer is one which can be etched with an etchant which does not substantially etch the material of the body and which has a crystalline lattice which substantially matches that of the body. The coated body is heated to diffuse the conductivity modifier into the body. At least a portion of the layer is etched away using the etchant which does not substantially etch the body to expose at least a portion of the surface of the body.

DETAILED DESCRIPTION

Figure 1:
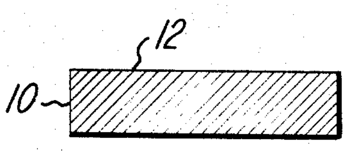
FIGS. 1–4 are sectional views illustrating the various steps of the method of the present invention.
Figure 2:
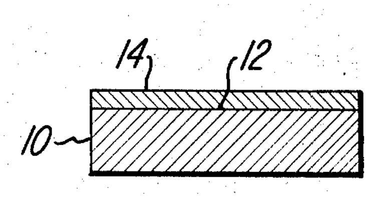

As shown in FIG. 1, the method of the present invention starts with a body 10 of single crystalline gallium arsenide (GaAs) or aluminum gallium arsenide which contains a relatively low concentration of aluminum ($Al_xGa_{x-1}As$ where $x$ is less than approximately 0.4). The body 10 may be of either conductivity type, i.e., either P type or N type. A surface 12 of the body 10 is then coated with a layer 14 of a single crystalline semiconductor material which can be etched by an etchant which will not substantially etch the body 10 and which has a crystalline lattice which substantially matches the crystalline lattice of the body 10, such as aluminum gallium arsenide having a relatively high concentration of aluminum ($Al_xGa_{x-1}As$ where $x$ is greater than approximately 0.4). The layer 14 includes therein a conductivity modifier of the type to form the desired region in the body 10. If a P type region is desired, the conductivity modifier may be zinc, germanium or cadmium. If an N type region is desired, the conductivity modifier may be tellurium, sulfur or tin.

Figure 5:
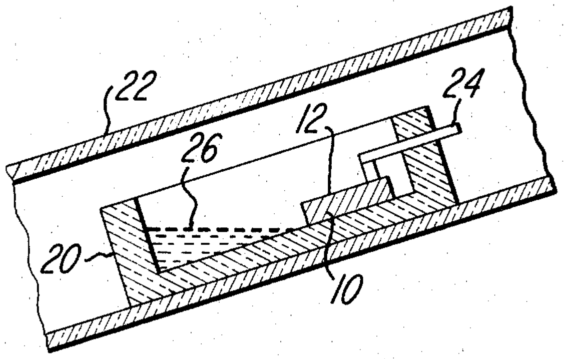
FIG. 5 is a diagrammatic representation of apparatus which can be used for carrying out the method of the present invention.

The layer 14 is formed on the surface 12 of the body 10 by the well known technique of liquid phase epitaxy which has been generally described in an article by H. Nelson entitled "Epitaxial Growth of GaAs and Ge from the Liquid State and its Application to the Fabrication of Tunnel and Laser Diodes," RCA Review, Volume 24, pages 603–615, Dec. 1965. A suitable apparatus for carrying out this method is illustrated diagrammatically in FIG. 5. As shown, there is a boat 20 of graphite, for example, disposed within a quartz furnace tube 22 which may be heated electrically in a manner well known in the art. The body 10 is disposed within the boat 20 and is held firmly against the floor thereof by means of a clamp indicated diagramatically at 24. In the lowermost portion of the boat 20, in the tilted condition thereof as shown in FIG. 5, there is a melt 26 which comprises a mixture of the desired crystalline substance to form the material of the layer 14, such as gallium arsenide and aluminum to form aluminum gallium arsenide, and the appropriate conductivity modifier in a solvent therefor, such as gallium. In order to maintain a non-oxidizing atmosphere around the body 10, a continuous flow of an inert gas or hydrogen, for example, is forced through the furnace tube 22.

With the constituents of the melt 26 and the body 10 in place within the boat 20 and with the furnace tube 22 tipped as shown in FIG. 5, the system is heated to a temperature suitable to the growth of the material of the layer 14. As the temperature within the furnace tube rises, the solvent melts and the substances dissolve therein. When the temperature reaches the preferred temperature known as the "tip temperature," the heat input is stopped and the furnace tube 22 is tipped so that the melt 26 floods and covers the exposed surface of the body 10. At this time the solvent is nearly saturated with the desired crystalline substance. As the furnace cools, the body 10 initially dissolves at the surface 12 thereof until a solution equilibrium is established. Upon further cooling, precipitation of the desired substance from the solution and epitaxial growth upon the body occurs. After the epitaxial layer 14 is grown to the desired thickness, the furnace tube 22 is tipped back to its original position so as to decant the remaining molten charge from the surface.

Figure 3:
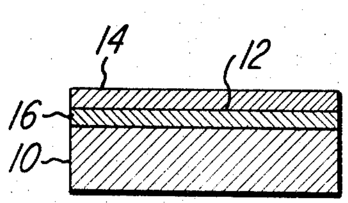

The coated body 10 is then heated to a temperature to diffuse the conductivity modifier from the layer 14 into the body 12 and thereby form the region 16 of the desired conductivity type in the body 10 along the surface 12 as shown in FIG. 3. The temperature at which the diffusion will occur will vary with the particular conductivity modifier being diffused. However, the diffusion temperature will generally be between 850°C and 1,000°C. The time of diffusion is selected according to the desired thickness for the region 16. If, during the formation of the layer 14, the tip temperature is made relatively high, the region 16 may be diffused simultaneously with the formation of the layer 14. Alternatively, the tip temperature may be a relatively lower value and after completion of the formation of the epitaxial layer 14, the resulting structure may be heated for a time sufficient to produce the region 16 by diffusion of the conductivity modifier from the layer 14.

Figure 4:
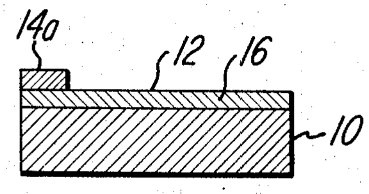

After the region 16 is formed, at least a portion of the layer 14 is removed to expose the surface 12 of the body 10 as shown in FIG. 4. The layer 14 is removed by contacting it with an etchant which will etch the material of the layer 14 but will not substantially etch the material of the body 10. A layer 14 of aluminum gallium arsenide having a relatively high concentration of aluminum ($Al_xGa_{1-x}As$ where $x$ is greater than approximately 0.4) can be etched with boiling hydrochloric acid and the etchant will not attack a body of either gallium arsenide (GaAs) or aluminum gallium arsenide having a relatively low concentration of aluminum ($Al_xGa_{1-x}As$, where $x$ is less than approximately 0.4). If desired, the entire layer 14 can be removed to expose the entire surface 12 of the body 10. However, since the layer 14 will generally contain a higher concentration of the conductivity modifier than is in the region 16 and will therefore be of a higher conductivity than the region 16, by leaving a portion 14*a* of the layer 14 on the surface 12 as shown in FIG. 4, the portion 14*a* will provide a good ohmic contact to the region 16.

The following is a specific example of forming a thin region of P type conductivity in a body of gallium arsenide of N type conductivity.

EXAMPLE

A mixture of 5 grams of gallium and 7 grams of gallium arsenide are placed in a boat 20 of the type shown in FIG. 5, and the boat is placed in a furnace tube 22. The furnace tube is heated to a temperature to heat the mixture to 950°C to achieve a thorough mixing of the ingredients of the mixture. After heating for 5 minutes the mixture is cooled to room temperature. To the mixture of gallium and gallium arsenide in the boat is added 100 milligrams of aluminum and 330 milligrams of zinc, and a body of N type gallium arsenide having a carrier concentration of silicon of 1 to 2 × $10^{18}cm^{-3}$ is mounted in the boat. With the furnace tube in the tilted position as shown in FIG. 5, the furnace tube is heated to a temperature of 950°C to melt the mixture. The heat is turned off and the furnace tube is allowed to cool. At a temperature of 930°C the furnace tube is tipped to flood the body with the melt. When the furnace tube reaches a temperature of about 400°C it is tipped back to its original position so as to decant the remaining molten charge from the body. This produces on the surface of the body an epitaxial layer of aluminum gallium arsenide containing zinc which is approximately 38 micrometers thick.

The coated body is removed from the boat and the epitaxial layer is lapped to a thickness of approximately 25 micrometers to clean the surface of the layer. The coated body is then placed in a quartz vessel which is evacuated and filled with gaseous zinc arsenide. The vessel is then heated to a temperature of approximately 850°C for about 15 minutes. This diffuses the zinc from the epitaxial layer into the body to form a region of P type conductivity approximately 1.5 microns deep at the surface of the body. The coated body is removed from the vessel and placed in hydrochloric acid which is heated to a temperature of between 80°C and 100°C. This etches away the epitaxial layer to expose the surface of the body.

In the method of the present invention, by diffusing the conductivity modifier into the body 10 from a semiconductor material which has a crystalline lattice which substantially matches the crystalline lattice of the body and which can be easily removed without affecting the material of the body, the resulting surface of the body will be smooth and free of crystal damage both at the surface and directly beneath the surface. Also, since the source of the conductivity modifier is an epitaxially grown layer, the concentration of the conductivity modifier in the layer can be easily controlled during the epitaxial growth so that a desired concentration profile of the conductivity modifier in the diffused region 16 can be easily obtained by simply controlling the diffusion heat treatment schedule. By forming the epitaxial layer by the liquid phase epitaxy technique, there is also eliminated the possibility of introducing any undesirable contaminants into the body. In addition, the method of the present invention provides for ease of forming ohmic contacts to the diffused region by merely leaving a portion of the epitaxial layer 14 on the surface 12 of the body. Thus, there is provided by the present invention a method of forming a surface region of a desired conductivity type in a semiconductor body without causing any crystalline damage in or directly beneath the surface of the body and with ease of providing a desired profile of the conductivity modifier in the region. Also, the method provides for use of forming a high conductivity ohmic contact to the region if such a contact is desired.

We claim:

1. A method of forming in the surface of a body of single crystalline gallium arsenide or aluminum gallium arsenide a region of a desired conductivity type comprising steps of
   a. depositing on said surface of the body a layer of a single crystalline material which can be removed by an etchant which will not substantially etch the material of the body and which has a crystalline lattice which substantially matches that of the body, and which layer contains a conductivity modifier of the desired conductivity type,
   b. heating the coated body to diffuse the conductivity modifier into the body, and
   c. etching away at least a portion of said layer by an etchant which does not substantially etch the body to expose at least a portion of said surface of the body.

2. The method of claim 1 whrein the layer is epitaxially deposited on the surface of the body.

3. The method of claim 2 wherein the layer is epitaxially deposited on the surface of the body by the technique of liquid phase epitaxy.

4. The method of claim 1 wherein the material of the layer is single crystalline aluminum gallium arsenide.

5. The method of claim 4 wherein the material of the body is gallium arsenide or aluminum gallium arsenide having a concentration of aluminum substantially less than the concentration of aluminum in the layer.

6. The method of claim 5 wherein the layer is etched with hydrochloric acid.

* * * * *